(12) United States Patent
Schultz

(10) Patent No.: US 9,709,964 B2
(45) Date of Patent: Jul. 18, 2017

(54) GENSET POWER CONTROL IN POWER SYSTEMS

(71) Applicant: Cummins Power Generation IP, Inc., Minneapolis, MN (US)

(72) Inventor: Mark Schultz, Minneapolis, MN (US)

(73) Assignee: CUMMINS POWER GENERATION IP, INC., Minneapolis, MN (US)

(*) Notice: Subject to any disclaimer, the term of this patent is extended or adjusted under 35 U.S.C. 154(b) by 392 days.

(21) Appl. No.: 14/329,072

(22) Filed: Jul. 11, 2014

(65) Prior Publication Data
US 2016/0011569 A1    Jan. 14, 2016

(51) Int. Cl.
G06F 19/00    (2011.01)
G05B 11/42    (2006.01)
H03L 5/02    (2006.01)
H02J 3/46    (2006.01)

(52) U.S. Cl.
CPC .............. G05B 11/42 (2013.01); H02J 3/46 (2013.01); H03L 5/02 (2013.01)

(58) Field of Classification Search
CPC .......... G05B 11/02; G05B 11/42; F02D 25/00
USPC ........................................ 307/153; 700/291
See application file for complete search history.

(56) References Cited

U.S. PATENT DOCUMENTS 5,077,485 A    12/1991  Rashid
6,555,929 B1*   4/2003  Eaton ................... F02D 11/105
                                                            290/24
2006/0119325 A1   6/2006  Mrowiec et al.
2011/0148214 A1*  6/2011  Dahlen ..................... H02J 3/40
                                                            307/87
2012/0205986 A1   8/2012  Frampton et al.
2014/0290591 A1* 10/2014  Filip ....................... F02D 25/00
                                                            123/2
2015/0097437 A1*  4/2015  Votoupal ................... H02J 3/48
                                                            307/84
2016/0036367 A1*  2/2016  McCall ................ G05B 13/021
                                                            318/149
2016/0036450 A1*  2/2016  McCall ................ G05B 13/021
                                                            700/287

FOREIGN PATENT DOCUMENTS

WO    WO-2006/126003    11/2006

OTHER PUBLICATIONS

Rajamäki, Rami. "Load Sharing Communication between Different Engine/Generator Controllers." (2015).*

(Continued)

Primary Examiner — Michael D Masinick
(74) Attorney, Agent, or Firm — Foley & Lardner LLP

(57) ABSTRACT

A method includes determining an average set load corresponding to a plurality of gensets of a power system, generating a power error based on the determined average set load and a set load of a genset of the plurality, generating a first offset based on a function of the power error and a predetermined factor, determining a secondary offset, generating a final offset based on the first offset and the secondary offset, generating a final reference value based on a nominal reference and the final offset, and applying the final reference value to obtain proportional load sharing between the plurality of gensets.

20 Claims, 6 Drawing Sheets

(56) References Cited

OTHER PUBLICATIONS

Makarov, Y. V., et al. "Incorporating wind generation and load forecast uncertainties into power grid operations." Report PNNL-19189, PNNL (2010).*

Ninad, Nayeem Ahmed. Control Strategies for Power Electronic Interfaces in Unbalanced Diesel Hybrid Mini-Grids with Renewable Sources and Storage. Diss. Concordia University, 2013.*

The International Search Report and Written Opinion of the International Searching Authority issued in PCT/US2015/039600, dated Sep. 8, 2015.

* cited by examiner

GENSET POWER CONTROL IN POWER SYSTEMS

BACKGROUND

Controlling the distribution of a load between generator sets (hereinafter "gensets") is important to avoid overloading and stability problems on the system's gensets. In a paralleled system, load sharing includes the proportional division of the total load of the real power (kW) and reactive power (kVar) between the gensets. Typically, the system includes two separate control systems, namely, an engine speed governor and an automatic voltage regulator (AVR), for controlling the real power and the reactive power, respectively.

Regarding the real power, the engine speed governor of each genset generally determines the proportional sharing of the total real power requirements of the system. The kW load sharing is achieved by increasing or decreasing fuel to the system's engines. The control of the gensets via the engine speed governor involves monitoring and controlling the sharing of the total kW load in proportion to the relative rating of the engines on the system's gensets.

As to the reactive power, an alternator field excitation system of each genset controls the proportional sharing of the total reactive power requirements of the system. The kVar load sharing is achieved by increasing or decreasing the field excitation to the system's alternators. The control of the gensets via the AVR involves monitoring and controlling the sharing of the total kVar load in proportion to the relative rating of the alternators on the system's gensets.

A typical analog load share system use two pairs of bidirectional analog lines connected between gensets. One pair is used for kW sharing and the other for kVar sharing. The lines are used by the gensets to determine how much load each genset should take. They generally operate by each genset applying a voltage to the lines that is proportional to the power on that set. The result of the voltages applied by each genset to the load share lines is a voltage that is proportional the total system load divided by the total number of gensets connected together. By reading this value on the load share lines each genset knows what proportion of the load it should take. Each genset compares this value to the gensets actual load and creates an offset adjustment which is applied to the AVR (to control kVars) or governor (to control kW's) to raise or lower the genset load to match the load measured on the load share lines.

SUMMARY

This disclosure generally relates to power systems and methods for controlling power systems, and in particular, controlling power systems that include a plurality of gensets configured for load sharing and methods for controlling the loads between the gensets ("connected power systems"). The described systems and methods generally involve the use of a network load sharing system and Standard Proportional Integral ("PI") controller algorithms, where the controller may have a transfer function of the form: $K(s)=Kp+Ki/s$, with a gain of $Kp$, and an integral term of $Ki/s$. In some examples, the systems and methods can allow individual control of the maximum power of each genset. In some other examples, the systems and methods allow precise load sharing control over various operating conditions. In some examples, the systems and methods allow proportional load sharing to be obtained, for example, without calibrating as in existing analog load share systems.

In one embodiment, the connected power system includes a plurality of gensets that is operable to supply power. Each of the gensets includes an engine that is connected to a generator and control systems for controlling the real power (kW) and the reactive power (kVar). Each of the gensets may be connected by a network (e.g., Ethernet, CAN, RS485, wireless, etc.), which can be connected set-to-set or through a switch.

The connected power system further includes circuit breakers that are provided between the outputs of the generators and a bus. Each of the circuit breakers can be configured to allow the respective output of the respective generator to connect or disconnect to the bus depending on whether the breaker is closed or open. The bus can be generally configured to receive power from the gensets when their respective breakers are closed, and transmit the received power to the load.

The connected power system also includes one or more load sharing controllers. In some examples, the connected power system includes a load sharing controller for each of the gensets. The load sharing controller can be connected to a network node that is generally configured to receive data, e.g., regarding the gensets, and process the received data.

Generally, the control systems for controlling the real power and the reactive power, the load sharing controller, and the network node can receive input data, process the input data, and transmit the output data. The input and output data are utilized by algorithms stored in a memory of the respective components to control the system. The algorithms generally involve proportional load share control between the gensets, control of the balance of the loads between the gensets using offsets (note that the term "offsets" will be described in detail below), and control of offsets themselves.

In one embodiment, the algorithm involves determining an average set load, generating a power error based on the determined average set load and a set load (note that the terms "average set load" and "set load" will be described in detail below), generating a first offset based on a function of the power error and a predetermined factor (note that the terms "power error" and "predetermined factor" will be described in detail below), generating a final offset based on the first offset and a secondary offset, and generating a final reference value based on a nominal reference and the final offset (note that the terms "final reference value" and "nominal reference" will be described in detail below). In some instances, the above steps are conducted separately for each of the gensets.

In some examples, the algorithm further involves controlling the secondary offset by determining an offset selection at the network node (note that the term "network node" will be described in detail below) for each of the gensets and determining a power offset based on the offset selection. In some examples, the offset selection is a local offset state or a system offset state. In some examples, a local offset is obtained when in the local offset state, and a system offset is obtained when in the system offset state. In some examples, the system offset is a negative sum of the local offsets of the gensets in the local offset state divided by the number of gensets in the system offset state.

In some examples, the load sharing controller includes a PI controller, and the local offset state is selected when the PI controller is in the on state and/or the network node is power limited. In some examples, the network node is power limited when the power is intentionally limited such as when load ramping, when setting a limit that is greater than a maximum limit, and/or when the PI controller is saturated.

In some examples, the system offset state is selected when the local offset state is not selected.

In some examples, the algorithm further involves determining whether the PI controller should be in the on or off state. In some examples, the PI controller is switched to the off state based on the following conditions: (1) there are no gensets with the PI controller in the off state and if the network node is the lowest in a limited address; (2) the number of gensets online is less than or equal to one; (3) a paralleling state is not in load share mode; (4) there is a loss of communication with the network node; and/or (5) the total system load is greater than a maximum limited capacity.

In some examples, the PI controller is switched to the on state based on the following conditions: (1) the paralleling state is in load share mode, the number of gensets online is greater than one, the total load is less than the maximum limited capacity and two or more PI controllers are in the off state, and the network node has the highest address; and/or (2) the set load is greater than a limit set for derating or ramping.

In some examples, when the PI controller is in the on state, the algorithm further involves (1) determining an average non-limited load; (2) generating a power error based on the determined average non-limited load and a set load; (3) determining if the network node is limited based on a predetermined reference value; and if the network node is not power limited, (4) generating a local offset based on a function of the power error and a predetermined factor, for example, a load share gain.

In some examples, the algorithm is implemented when a genset is added to the system and load ramping is occurring. In this instance, the algorithm further involves initializing a PI reference in the PI controller to a desired load on the genset being added.

DETAILED DESCRIPTION

I. Networked/Connected Power System

Figure 1:
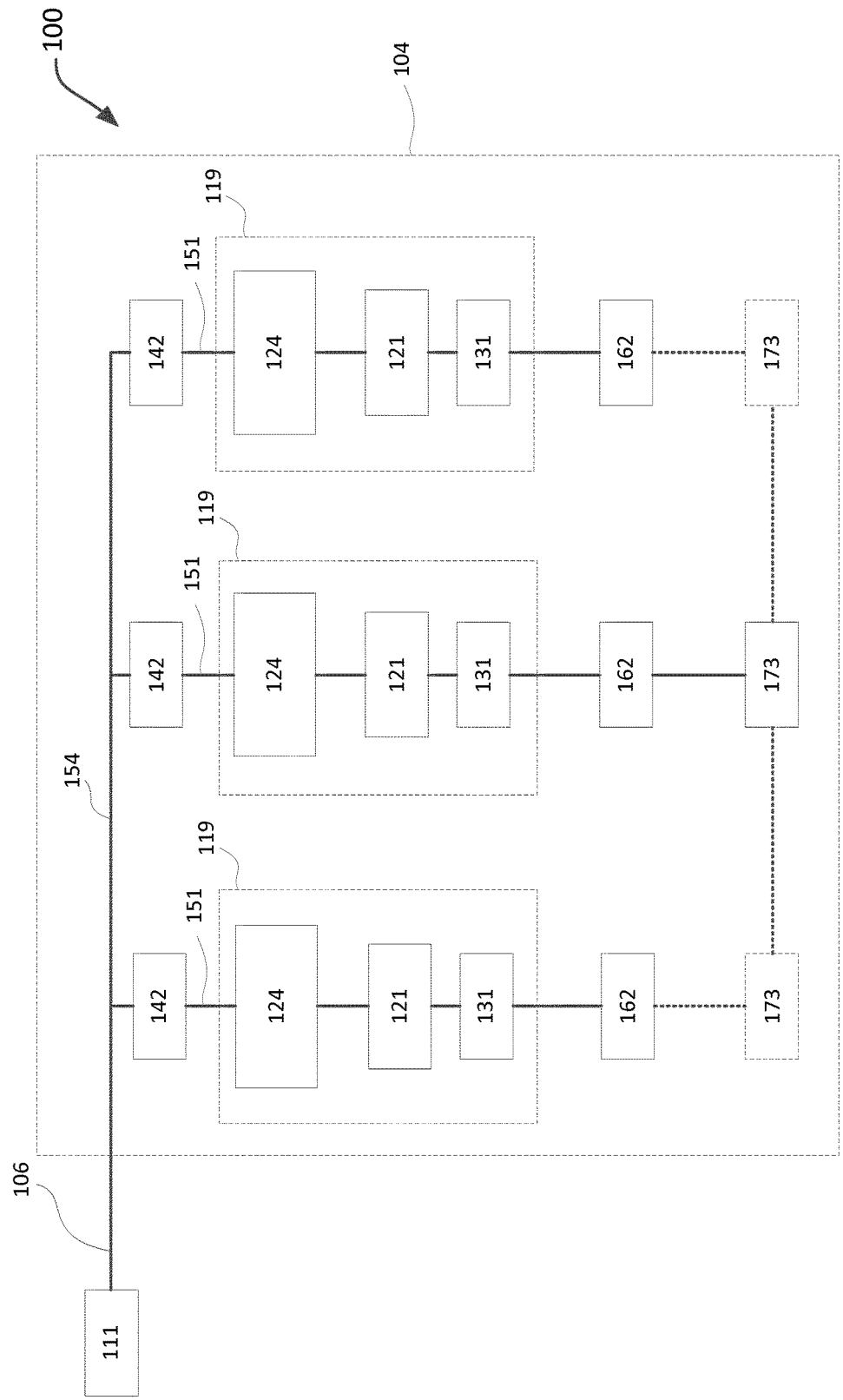
FIG. 1 is a block diagram illustrating a connected power system, according to one embodiment.

Referring to FIG. 1, a connected power system 100 is shown according to one embodiment. FIG. 1 will be generally referenced throughout the description below as a representative example of a connected power system.

In some examples, the power system 100 is distinguishable from an analog system in that offsetting of a load is accomplished by applying an offset to load share lines, as will be discussed in more detail below.

The power system 100 includes a generator-driven power source 104 that is configured to supply power and a power transmission network 106 for transferring power from the power source 104 to a load 111. The load 111 can be, for example, a device that requires uninterrupted power to operate, e.g., lights, motors, etc. for industrial applications. The load 111 is configured to receive power in a three-phase alternating current.

In some embodiments, the generator-driven power source 104 includes a plurality of gensets 119. Note that FIG. 1 illustrates the power system 100 as including three gensets, but the number of gensets can be any number of gensets suitable for use in a connected power system, including, but not limited to, two to fifty.

Each of the gensets 119 includes an engine 121 that is connected to a generator 124. The engine 121 can be any type of engine that is suitable for producing mechanical power including, but not limited to, a diesel engine, a natural gas engine, and a gasoline engine, etc. The generator 124 can be any type of generator that is suitable for converting the mechanical power produced by the engine to electrical power, including, but not limited to, an alternator. Each of the gensets 119 is configured to generate power in a three-phase alternating current.

In one embodiment, each of the gensets 119 can include control systems 131 for controlling the real power (kW) and the reactive power (kVar). In some examples, the real power is controlled by an engine speed governor in addition to maintaining the genset output frequency at a constant value, and the reactive power is controlled by an automatic voltage regulator (AVR) in addition to maintaining the genset output voltage at a constant value. Each of the control systems 131 can include a processor (not shown), a memory (not shown) and an input/output (I/O) interface (not shown). Note that in FIG. 1, the AVR and the engine speed governor of the control systems 131 are illustrated as being included in one component. However, in some examples, the control system for controlling the real power can be separate from that of the reactive power.

As to the real power, in some examples, the engine speed governor of each control system 131 determines the proportional sharing of the total real power requirements of the system 100. The kW load sharing can be achieved by increasing or decreasing fuel to the system's 100 engines 121. Control via the engine speed governor can involve monitoring and configuring the sharing of the total kW load in proportion to the relative rating of the engines 121 on the system's gensets 119.

As to the reactive power, in some examples, the AVR of each control systems 131 control the proportional sharing of the total reactive power requirements of the system 100. The kVar load sharing is achieved by increasing or decreasing the field excitation to the system's generators 124. The control of the gensets 119 via AVR can involve monitoring and controlling the sharing of the total kVar load in proportion to the relative rating of the generators 124 on the system's gensets 119.

As indicated above, the real and reactive powers can be controlled separately, for example, where the reactive power is controlled by offsetting the AVR (excitation) and the real power is controlled by offsetting the governor (engine fueling).

The power system 100 can further include circuit breakers 142 that are provided between the outputs 151 of the generators 119 and a bus 154. Each of the circuit breakers 142 can be configured to allow the respective output 151 of the respective generator 119 to connect or disconnect to the bus 154 depending on whether the breaker 142 is closed or open. The bus 154 can be generally configured to receive power from the gensets 119 when their respective breakers 142 are closed, and transmit the received power to the load 111.

The power system 100 can also include one or more load sharing controllers 162. In some examples, the power system 100 includes a load sharing controller 162 for each of the gensets 119 as illustrated in FIG. 1. Each of the load sharing controllers 162 can include a processor (not shown), a memory (not shown), an input/output (I/O) interface (not shown) and a PI controller (not shown).

Yet in some other embodiments, the load sharing controller 162 can be connected to a network node 173 that is generally configured to receive, process, and transmit data, e.g., data regarding the gensets 119. The network node 173 can include a processor (not shown), a memory (not shown), an input/output (I/O) interface (not shown) and a PI state machine (now shown). In some example, the network node 173 may be part of the load sharing controller 162. In some examples, the network node 173 is operably connected to a communication network. The communication network can be used to network the control systems 131 of the gensets 119 to transmit data regarding the gensets 119 to the network node 173.

Note that in the example illustrated in FIG. 1, one network node 173 is illustrated as being connected to the load sharing controllers 162 and the communication network. However, it is to be realized that any number of network nodes 173 can be utilized that is suitable for use in the power system 100. In some examples, one network node 173 is provided for each of the gensets 119. In other examples, one or more network nodes 173 can be provided for multiple groups of gensets 119. In general, the network node 173 gathers data from the gensets, and performs the calculations depicted by regions 308, 422, and 442 in FIG. 4, and sends the result to the load share control.

During operation, the network node 173, for example, can receive information as input from various components including the load sharing controllers 162; process the received information using its processor based on an algorithm stored in the memory; and/or transmit information as output to various components, including the respective load sharing controllers 162. The load sharing controllers 162, for example, can likewise receive information as input from various components including network node 173; process the information received from the network node 173; and transmit information as output to various components including the control systems 131 and the network node 173. The control systems 131, for example, can receive information from the respective load sharing controllers 162 as input, and send command signals as output to the respective engines 121 and the generators 124 so as to control the output of the gensets 119. The control systems 131, for example, also can transmit information as output regarding the gensets 119 via a communication network.

II. Summary of Input and Output Data

Figure 2:
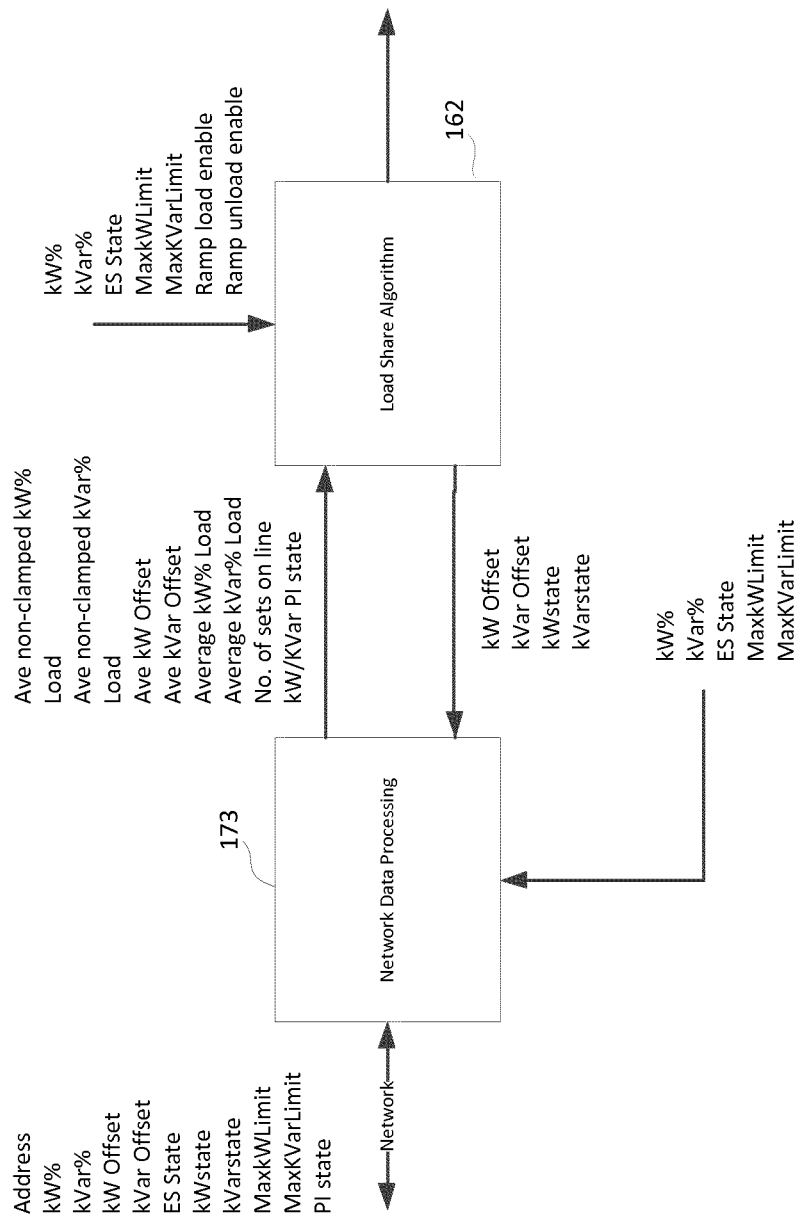
FIG. 2 is a schematic diagram illustrating inputs and outputs of a network node and a load sharing controller, according to one embodiment.

FIG. 2 depicts the input and output data of the network node 173 and the load sharing controller 162. The inputs and outputs of the network node 173 include, but are not limited to: address information of the genset (address), set load (kW % and kVar %), local offset (kW Offset and kVar Offset), load share state (kW state and kVar state), PI controller state (PI state), maximum load limit (MaxkWLimit and MaxkVarLimit) and paralleling state. The outputs of the network node 173 further include, but are not limited to: average non-limited load (Ave non-clamped kW % Load and Ave non-clamped kVar % Load), system offset (Ave kW Offset and Ave kVar Offset), average set load (Average kW % Load and Average kVar % Load) and number of gensets that are online (No. of sets online). Note that the term "online" can mean that the circuit breaker 142 is closed and the genset control is in the load share mode.

The inputs of the load sharing controllers 162 include, but are not limited to: average non-limited load (Ave non-clamped kW % Load and Ave non-clamped kVar % Load), system offset (Ave kW Offset and Ave kVar Offset), average set load (Average kW % Load and Average kVar % Load), number of gensets that are online (No. of sets online), PI controller state (PI state), set load (kW % and kVar %), paralleling state (ES state), maximum load limit (MaxkWLimit and MaxkVarLimit) and ramp loading state (Ramp load enable and Ramp unload enable). The outputs of the load sharing controllers 162 include, but are not limited to: local offset (kW Offset and kVar Offset), load share state (kWstate and kVarstate) and final offset (Final Offset).

Generally, the input and output data are utilized in algorithms stored in the memory, for example, of the network node 173 and/or the load sharing controller 162, to control the system 100, and are described with respect to how they are utilized by the algorithms. The algorithms generally involve proportional load share control between the gensets, control of the balance of the loads between the gensets using offsets, and control of offsets.

III. Overview of Load Sharing and Offset Control Algorithms

Figure 3:
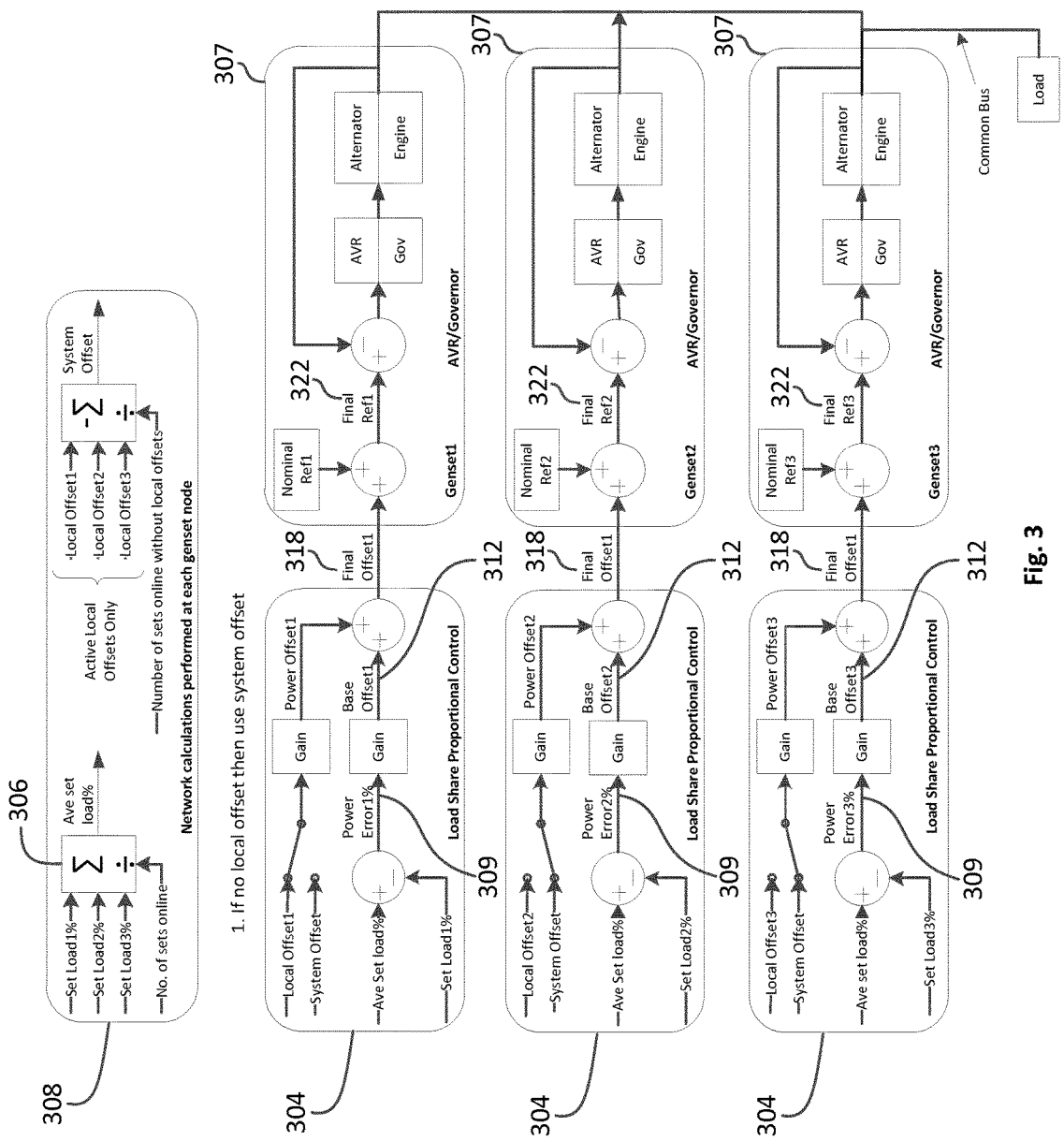
FIG. 3 is a block diagram illustrating proportional load share control and control of the balance of the loads between gensets, according to one embodiment.

FIG. 3 provides a block diagram illustrating proportional load share control and control of the balance of the loads between the gensets using offsets in three gensets. In particular, FIG. 3 shows regions 304 for Load Share Proportional Control, regions 307 for gensets 1, 2 and 3 and a region 308 for Network Calculation. Gensets 1, 2 and 3 can correspond to the gensets 119 shown in FIG. 1. Each of the regions 304 illustrates a schematic for each of the load sharing controllers 162. Each of the regions 307 illustrate a schematic for each of the control systems 131 that is provided in each of the gensets 119. The region 308 illustrates a schematic for network node 173.

Figure 4:
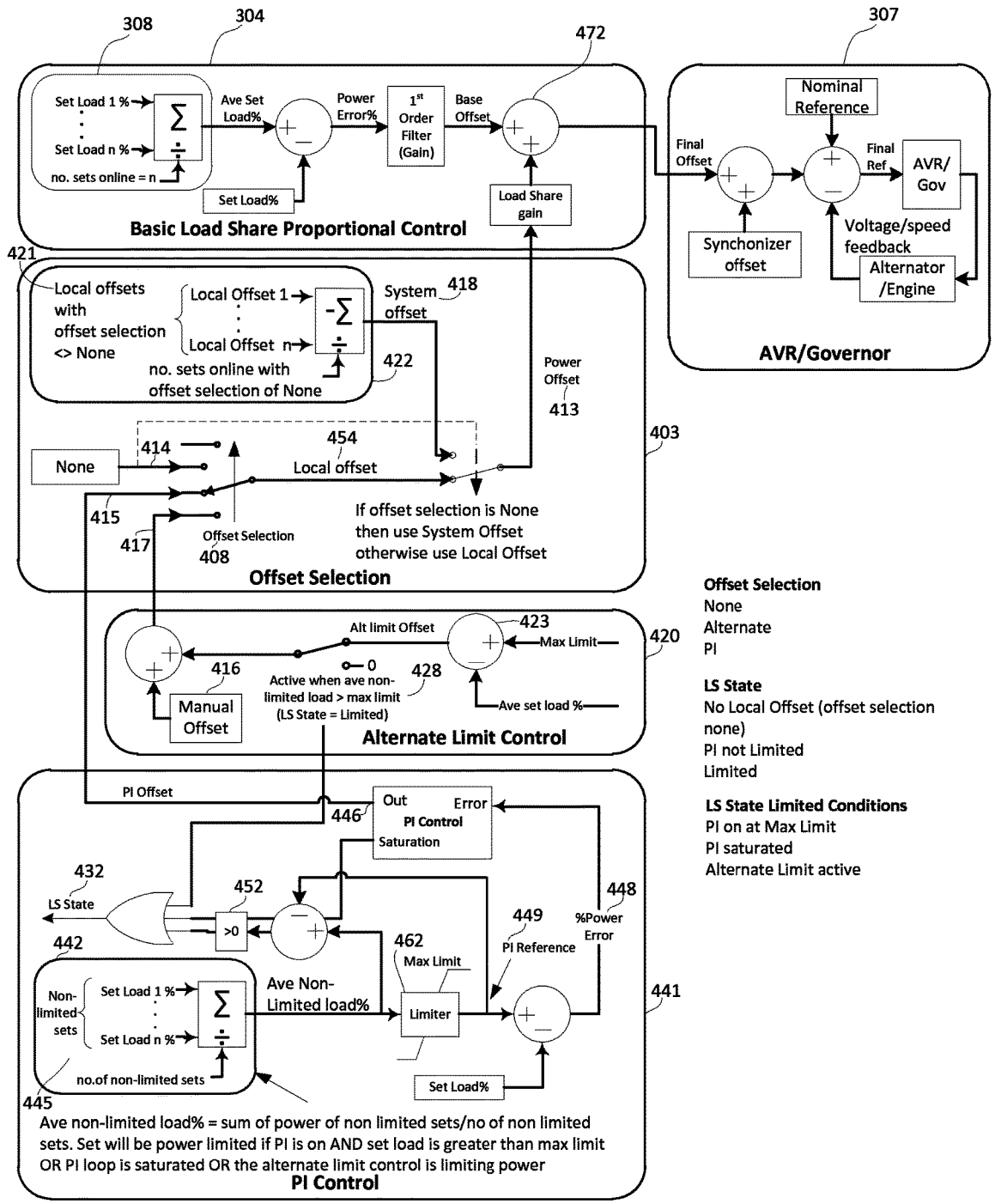
FIG. 4 is a block diagram illustrating proportional load share control between gensets, control of the balance of the loads between the gensets using offsets, and control of the offsets in one of the gensets, according to one embodiment.

FIG. 4 provides a block diagram illustrating proportional load share control between the gensets, the control of the balance of the loads between the gensets using offsets, and the control of the offsets themselves in one of the gensets 1, 2 and 3 in FIG. 3. In particular, FIG. 4 shows one of the regions 304 in FIG. 3 for Load Share Proportional Control, one of the regions 307 in FIG. 3 for gensets 1, 2 and 3, a region 403 for Offset Selection, a region 420 for Alternate Limit Control and a region 441 for PI Control. The region 304 in FIG. 4 illustrates a schematic for one of the load sharing controllers 162. The region 307 illustrates a schematic for one of the control systems 131. The region 403 illustrates a schematic for one of the load sharing controllers 162. The region 420 illustrates a schematic for one of the load sharing controllers 162. The region 441 illustrates a schematic for one of the load sharing controllers 162.

IV. Basic Proportional Load Share Control

Details of the proportional load share control and control of the balance of the loads between the gensets using offsets in gensets 1, 2 and 3 will now be described with reference to FIG. 3. The operations of the proportional load share control are illustrated in the regions 304, 307 and 308. Note that in the example shown in FIG. 3, regions 304 and 307 are implemented separately for each of the three gensets (gensets 1, 2 and 3). Region 308 is the same for each of the three gensets (gensets 1, 2 and 3), as described in more detail below.

In general, the operations of the proportional load share control involve (1) determining an average set load (Ave Load %)(306), (2) generating a power error (Power Error1%, Power Error2% and Power Error3%) based on the determined average set load (Ave Load %) and a set load (Set Load %)(309), (3) generating an offset, for example, a base offset (Base Offset1, Base Offset2 and Base Offset3), based on a function of the power error (Power Error1%, Power Error2% and Power Error3%) and a predetermined factor, for example, a load share gain (Gain)(312), (4) generating a final offset (Final Offset1, Final Offset2 and Final Offset3) based on the base offset (Base Offset1, Base Offset2 and Base Offset3) and a power offset (Power Offset1, Power Offset 2 and Power Offset3)(318), and then (5) generating a final reference value (Final Ref1, Final Ref2 and Final Ref3) based on a nominal reference (Nominal Ref1, Nominal Ref2 and Nominal Ref3) and the final offset (Final Offset1, Final Offset2 and Final Offset3)(322). The term "nominal reference" reflects a nominal operating point of the control. For example, the nominal operating reference of the governor is typically, but not limited to, 1800 RPM (which produces 60 Hz at the alternator). In other words, the nominal operating reference is the operation point of the control if it were to run as the control was not offset by a load share control or other mechanism.

In some examples, step (1) can be implemented by the network node 173, steps (2)-(4) can be implemented by the load sharing controllers 162, and step (5) can be implemented by the control systems 131 for controlling the kW and kVar.

Details of steps (1)-(5) will now be described. Note that the steps will be described in reverse order beginning from the intended result in step (5).

Generally, when the gensets 119 in the system 100 are connected together, the voltage and frequency of all the gensets 119 at the bus 154 will be forced to be the same because the alternators are three phase synchronous machines, and when their outputs are connected together the electromagnetics force them into synchronization, (e.g., same speed and voltage). In order to prevent the load to transfer from one set to another, the final reference values (Final Ref1, Final Ref2 and Final Ref3 in FIG. 3) used by the respective AVRs and governors, for example, can be all be the same. Further, as the AVR and governor have integrators as part of their control loops any difference in final reference between the gensets may create an error that would be integrated and unbalance the system. Accordingly, the final references may move up and down a small amount, however, the average value of the all the references will remain the same. See the following equation (1).

$$\text{Final Ref1}=\text{Final Ref2}=\text{Final Ref3} \quad (1)$$

The final reference value is determined based on a final offset and a nominal reference (step (5) above, which is illustrated at 322 in FIG. 3). In one example, the final reference is a product of the final offset and the nominal reference.

The final offset is based on a base offset and a power offset. In one example, the final offset is determined as in the following equation (2).

$$\text{Final Offset}=\text{Base offset}+\text{Power offset} \quad (2)$$

The power offset in equation (2) is based on either a local offset or a system offset (step (4) above, which is illustrated at 318 in FIG. 3). Note that the local offset and the system offset will be discussed in detail below.

Since the base offset needed for correction is divided equally between the gensets, a bus operating point is a function of the nominal references, for example, the sum of all of the nominal references divided by the number of gensets. The bus operating point represents the operating point of the system when the gensets are sharing load. For example, if one genset is operating at 59 Hz and another genset is operating at 61 Hz, when connected together the operating point is 60 Hz. The bus operating point may be used to adjust the final reference before being used by the respective AVRs and governors. In the example shown in FIG. 3, the bus operating point is determined as in the following equation (3).

$$\text{bus operating point} = \frac{\text{nominal } ref\,1 + \text{nominal } ref\,2 + \text{nominal } ref\,3}{3} \quad (3)$$

The base offset is based on the power error and gain (step (3) above, which is illustrated at 312 in FIG. 3) as in equation (4) below.

$$\text{Base offset}=\text{power error \%}*\text{gain} \quad (4)$$

The average set load (average load %) and the set load (set load %) can be used to calculate the power error % (step (2) above, which is illustrated at 309 in FIG. 3) by using the following equation (5).

$$\text{power error \%}=\text{average load \%}-\text{set load \%} \quad (5)$$

In some examples, the average load % is calculated (step (1) above, which is illustrated at 306 in FIG. 3), for example, at the network node 173, by taking the set load % from each genset and dividing the set load % by the number of sets online.

As indicated above, the final reference values based on the base offsets are equal to one another. If, for example, during reactive power load sharing, there is a difference between the final reference values, the genset with the higher reference value would try to increase its excitation to increase the bus voltage while the genset with the lower reference value would try to lower its excitation to lower the bus voltage to match their reference values. The result would be, for example, that the reactive power would transfer from one genset to another genset so as to increase the reactive power until a shutdown fault occurred. The proportional control load share system, for example, can insure that the final reference values are equal to another.

As another example, consider a single genset running at 100% load. The average load % would be 100% and the set load would be 100%. The power error in this case would be zero. If a second genset is then connected, the average load would immediately change to 50% (the total system load is the same but the number of sets changes from 1 to 2). Since the genset loads cannot change instantaneously, the genset that had the load would see a power error (avg. load−set load) of 50%−100%=−50%. The newly connected genset (the second genset) would see a power error of 50%−0%=+50%. These errors would be multiplied by the load share gain to produce base offsets that are used for application to the AVR/governor. The genset that had the load would see a negative offset and the genset initially without load would see a positive offset. As the load balances out, the average and set loads on both gensets eventually would equalize and base offsets would become zero. If, for example, a disturbance caused a power shift, the proportional control system would create offsets to rebalance the load. Such a disturbance may include a load going on and off, or any momentary speed or voltage change, etc.

V. Meaning of "Offset"

The meaning of "offset" will be further illustrated with reference to the example provided in Table 1 below, in which three gensets, gensets 1, 2 and 3, are included in the system 100.

TABLE 1

Proportional Control Example (no offset)

| Genset | Nominal reference | Required offset to make final references equal (forced offsets = 0) | Power error required to produce the required offset (assume gain = 0.138) Power Error = Offset/gain |
|---|---|---|---|
| 1 | 102% | −2% | −14.5% |
| 2 | 100% | 0% | 0% |
| 3 | 98% | +2% | +14.5% |

As depicted in Table 1, the nominal references of gensets 1, 2 and 3 are not the same. Additionally, there are no local offsets, so all of the power offsets are zero. In this example, the nominal reference of genset 1 is 2% high and the nominal reference of genset 3 is 2% low. The load share voltage bus would be at the average of the nominal references (100% in this case). If no offset is applied, the final references would equal the nominal references. In order for the final references to be equal, an offset can be generated. The power error required to produce the required offset (to make the final references equal) can be calculated by dividing the required offset by the gain. In one example, an assumed gain is the default kVar load share gain. In the example above, the gain is 0.138. Generally, a small difference in nominal references can result in a large power error. Also, as the load share gain is increased, the error is generally decreased, but at some point, increasing the gain will result in an unstable system. This example has different nominal references, but this error could be created, for example, by metering calibration errors, impedance differences in load wiring, or other differences by a controller operation. A calibration offset (e.g., manual offset 416 in FIG. 4) can be applied to compensate for the error in this example. However, in general, the required offset changes with load.

VI. Additional Offset(s)

Generally, a proportional control system adjusts the load balance between the gensets in a load share system and can also be used for load ramping. As it is a proportional control system, it cannot drive a load share error to zero. The integral term of a PI control is required to drive the error to zero. In one example, the disclosed systems and methods address the operating conditions such as differences in metering and load connection impedances by utilizing an additional offset(s) other than the base offset discussed above to compensate for the differences, which can thereby eliminate, for example, potentially undesirable consequences of load share calibration in existing systems.

In some examples, the disclosed systems and methods allow the control of the offset at each genset and for precise limiting of genset power. For example, a communication network and incorporated PI control algorithms may be used for precise load sharing over various operating conditions without calibrating as in existing analog systems.

With regard to load ramping, the additional offset(s) also can be used for ramping load on and off as gensets are added and removed from a load share system. The additional offset(s), for example, can be used together with the base offset that comes from the proportional control algorithm discussed above to determine the final offset. Note that in some examples, the final references are kept the same. In this instance, an offset is applied to more than one genset. For example, if a positive offset is applied to one genset, then a negative offset is applied to one or more of the other gensets in the system.

VII. Overview of Control of Additional Offset(s)

Details of the control of the additional offset(s) will be described with reference to FIG. 4. As mentioned above, FIG. 4 illustrates proportional load share control between the gensets, the control of the balance of the loads between the gensets using the offsets and control of the offsets themselves for one of the gensets 1, 2 and 3 in FIG. 3 (note that gensets 1, 2 and 3 are described as corresponding to gensets 119 in FIG. 1). In FIG. 4, the algorithm for the proportional load share control for one of the gensets 119 is shown in regions 304 and 308 and the algorithm for the control of the balance of the loads for one of the gensets 119 is shown in region 307. Note that the regions 304, 307 and 308 in FIG. 3 correspond to the regions 304, 307 and 308 in FIG. 4.

In addition to illustrating proportional load share control for one of the gensets 119, FIG. 4 illustrates the control of the additional offsets. The algorithms for the control of the additional offsets are illustrated in the region 403 (Offset Selection), the region 421 (System Offset determination), the region 420 (Alternate Limit Control), the region 441 (PI Control) and the region 442 (Average non-limited load determination). In general, the algorithms illustrated in the regions 403, 420 and 441 are implemented by the load sharing controllers 162, while the algorithms illustrated in the regions 308, 421, and 442 are implemented by the network node(s) 173.

With reference to the region 403 in FIG. 4, the additional offset(s) for each of the gensets 119 can be selected to be a local offset or a system offset. Thus, the power offset 413 may be the local offset 454, which is obtained when in a local offset state, or a system offset 418, which is obtained when in a system offset state.

VIII. Offset Selection

In general, the algorithm for controlling the offsets includes, for example: (1) determining an offset selection at the network node 173; and (2) determining a power offset based on the offset selection. Step (1) is illustrated at 408 in FIG. 4, and step (2) is illustrated at 413 in FIG. 4. The power offset 413 selection can be from a local offset state or a system offset state (which may be selected in the absence of the local offset).

The local offset that is obtained when the offset selection is in a local offset state refers to the offset that is produced at each of the gensets 1, 2 and 3 and can come from different sources. The local offset state is selected, for example, if the PI controller included in the load sharing controller 162 is in the on state and/or the power is limited, as will be described in more detail below. If there is no local offset, the system offset state is selected and the system offset is used. In the example shown in FIG. 4, the system offset state is selected when the offset selection is "none" (see 414 in FIG. 4), whereas the local offset state is selected when the offset selection is either "Alternate" (see 417 in FIG. 4) or "PI" (see 415 in FIG. 4).

A. System Offset

As mentioned above, the system offset state is selected when the offset selection is "none" (see 414 in FIG. 4). When the system offset state is selected, the algorithm utilizes an output 418 from the algorithm illustrated in the region 422. The output 418 is a system offset value that is calculated based on the active local offsets of all the gensets 119.

In the example shown in FIG. 4, the system offset value 418 is determined by the network node 173 for each of the gensets 119 by receiving the local offset information from all of the other gensets 119, and calculating the system offset value 418 using the local offset information from all of the other gensets 119. In some examples, the system offset value that is calculated by the network node 173 for each of the gensets 119 is the same for all of the gensets 119.

In FIG. 4, the algorithm for determining the system offset value is illustrated at 422, and involves adding the offset values of the gensets 119 that are in the local offset state ("active local offsets"), dividing the active local offsets by the number of gensets that are in the system offset state (i.e., the number of gensets with an offset selection of "none"), and converting the resulting value to a negative value.

By way of example, consider the power system 100 having three gensets 119 where the offset selection for one of the gensets 119 is the local offset state, whereas the offset selection for the other two gensets is the system offset state. In the instance where the genset 119 that is in the local offset state has an offset value of 10%, the system offset value would be −10%/2=−5%. In this instance, the two gensets without the local offsets would each be offset by −5%.

By way of another example, consider the case where an offset by 10% of the power of genset 1 is desired. In order to accomplish this, the offset on genset 1 is equally divided between the gensets that are not offset, while the voltage and frequency of the genset system are unchanged. This means that if genset 1 is offset by 10%, genset 2 and genset 3 may need to be offset by −5%. To calculate the offset applied, the offsets of the gensets that have local offsets are added, and this total is divided by the number of the gensets that do not have local offsets. The resulting value is then converted to a negative value to give the system offset. After applying these offsets to all the sets, the gensets may stabilize at a new operating point where power error values equal the offset values (either local or system). When this point is reached, the offsets to the control systems (AVR or governor) may be zero. In some instances, the integral portion of the AVR/governor PID controls may cause their outputs to operate around a new steady state operating point that achieves the new load balance point.

B. Local Offset

Generally, the local offset state is active if the PI controller loop is enabled or the alternator limit control is operating. When a genset is ramping load on or off, its local offset is active. If there is no local offset the system offset may be used.

1. Overview of PI Controller

In some examples, the local offset state is selected when the PI controller is in the on state. The PI controller is in the on state when the PI controller is enabled to implement a control algorithm, as will be discussed in detail in Part B below. In one example, the offset selection is "PI" (see 415 in FIG. 4) when the PI controller is in the on state.

The control algorithm of the PI controller is illustrated in the region 441 in FIG. 4. The PI controller can be enabled (on state) or disabled (off state) to implement the control algorithm. In some examples, a PI controller enabling/disabling algorithm is implemented.

In one instance, the PI controller enabling/disabling algorithm is implemented so that at least one of the PI controllers is in the off state. In some examples, having at least one of the PI controllers in the off state allows an operating point to be set. That is, if the PI controller is running in the on state in all of the gensets 119, then there is no stable equilibrium point. An operating point can be set for the power system 100 by setting at least one genset 119 with a PI controller in the off state.

In some examples, the PI controller enabling/disabling algorithm involves enabling (on state) or disabling (off state) each of the PI controllers based on the operating conditions. In some instances, one or more of the gensets 119 with the PI controller in the off state is set to the desired power level by the other gensets 119 in the system 100. If a PI controller is enabled (on state) and it is limiting power on one genset, the remaining system load may be shared equally among the other gensets in the system.

a. Algorithm for Enabling/Disabling PI Controller

In some examples, control of the offsets includes determining whether the PI controller should be in the on or off state. In some instances, the determination of whether the PI controller should be in the on or off state is governed by a PI state machine that is included within the network node 173. In some instances, the PI state machine insures that the PI controller is not in the on state for all of the gensets 119.

Figure 5:
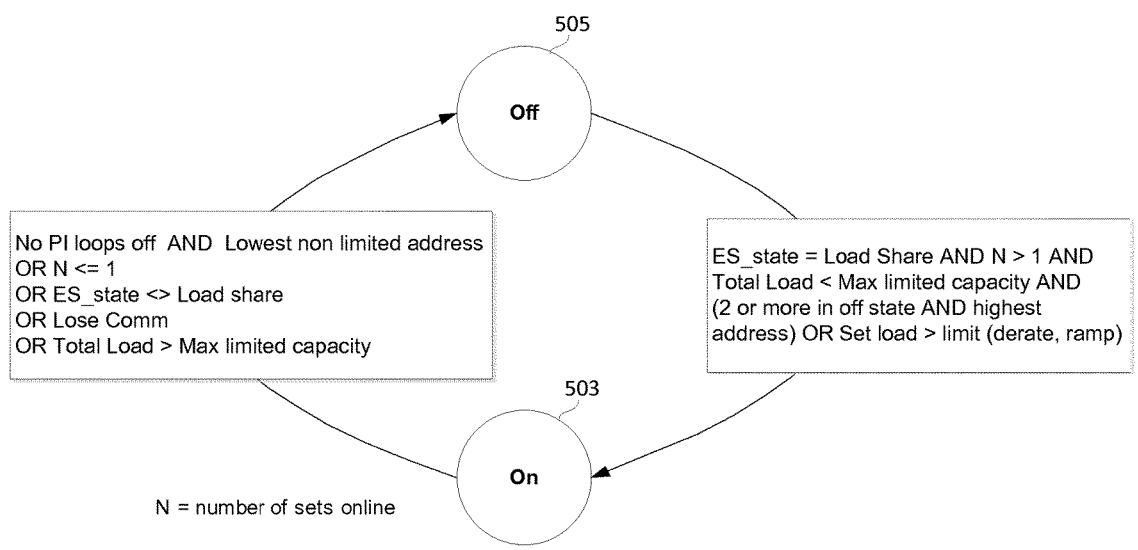
FIG. 5 is a diagram that illustrates a state machine to enable (on state) or disable (off state) the PI controller, according to one embodiment.

One example of the PI state machine to enable (on state) or disable (off state) the PI controller is illustrated in FIG. 5. The state machine generally involves switching between an on state 503 and an off state 505 based on certain conditions.

In the example shown in FIG. 5, the PI controller is switched to the off state 505 based on the following conditions (e.g., if any one of the following conditions are true the controller is switched to the off state): (1) there are no gensets with the PI controller in the off state and if the network node 173 is the lowest node address that is not power limited; (2) the number of gensets online is less than or equal to one; (3) the genset is not connected to load sharing bus; (4) there is a loss of communication with the network node 173; (5) the total load is greater than the maximum limited capacity.

The PI controller is switched to the on state 503 if (1) the paralleling state (ES state) is equal to the load share, the number of gensets online is greater than one, the total load is less than the maximum limited capacity and two or more PI controllers are in the off state, and the network node 173 has the highest address; or (2) the set load is greater than a limit set for derating or ramping.

An exemplary sequence of operational events of how the PI controllers are controlled by the PI state machine is provided in Table 2 below. In step 7 of Table 2, if the load on a genset becomes greater than a predetermined level, the PI loop can be enabled, which keeps the power on that particular genset from exceeding the predetermined level.

TABLE 2

| Step | Status | PI state Set 1 | PI state Set 2 | PI state Set 3 | PI state Set 4 | No. of Sets Online | |
|---|---|---|---|---|---|---|---|
| 1 | All sets off | Off | Off | Off | Off | 0 | |
| 2 | Set 1 goes online | Off | Off | Off | Off | 1 | one set so PI is Off |
| 3 | Set 2 goes online | Off | On | Off | Off | 2 | 2 sets online - PI enabled on set 2 |
| 4 | Set 3 goes online | Off | On | On | Off | 3 | Another set added - PI is enabled on set 3 |
| 5 | Set 4 goes online | Off | On | On | On | 4 | Another set added - PI is enabled on set 4 |
| 6 | Set 1 turns off | Off | Off | On | On | 3 | Set 1 goes off - causes set 2 PI to be disabled |
| 7 | Set 2 limits power | Off | On | Off | On | 3 | Set 2 limits which requires PI enabled - set 3 PI turns off |
| 8 | System overload | Off | Off | Off | Off | 3 | Overload - all PI controllers Off |
| 9 | Overload removed | Off | Off | On | On | 3 | Overload removed. Two PI controllers On | b. The Control Algorithm of the PI Controller

As mentioned above, the control algorithm is implemented when the PI controller is in the on state. The control algorithm is illustrated in the region 441 in FIG. 4. The control algorithm generally involves: (1) determining an average non-limited load (445); (2) generating a power error based on the determined average non-limited load and a set load (448); (3) determining if the network node 173 is limited based on a predetermined reference value (452); and if the network node 173 is non-limited, (4) generating a local offset based on a function of the power error and a predetermined factor, for example, a load share gain (454). In some examples, step (1) is implemented by the network node(s) 173, while steps (2)-(4) are implemented by the load share controllers 162.

The algorithm involved in determining the average non-limited load in step (1) is illustrated at 445. The algorithm involves adding the set load of the gensets 119 with the network node(s) 173 that is/are non-limited, and dividing this sum by the number of gensets with the network node(s) 173 that is/are non-limited.

The network node 173 is limited, for example, when the PI controller is in the on state and the output 446 of the PI controller has reached a predetermined threshold value(s), e.g., a maximum and/or a minimum value, or if PI reference 449 is clamped at a maximum limit. The network node 173 is non-limited, for example, where the PI controller loop is in the on state and the output 446 of the PI controller has not reached a predetermined threshold value(s). When the output 446 of the PI controller has reached a predetermined threshold value(s), the PI controller is saturated and is not controlled. In this instance, the set load of the genset with the saturated PI controller is not included in the load share power used by the network node(s) 173 that is/are non-limited.

c. Saturating the PI Controller

In some examples, the output 446 of the PI controller can be saturated using a limiter (462). Generally, the limiter (462) can be used to saturate the output 446 based on a predetermined reference value, e.g., a PI Reference value 449. The PI Reference value 449 can be determined, e.g., based on the average non-limited load. For example, when the PI controller is running it will force the set load % to equal the PI reference. If the average non-limited load is less than the max limit the PI loop will keep the set load equal to the average non-limited load. If the average non-limited load goes above the max limit, the PI loop will keep the set load % equal to the max limit, and in this condition the power is limited to the max limit value. In another instance, the PI Reference value can be set to the average non-limited load where the network node 173 is not limited. In this instance, the final offset 322 used would be based on the load share proportional control illustrated in the region 304.

In some embodiments, adjustable variables such as PI kW Low Limit and/or PI kW Hi Limit can be used to limit the output 446 of the PI controller. Based on these variables, an Absolute PI Low Limit and the Absolute PI Hi Limit can be calculated to be used as limits by the PI controller. For example, If PI kW Low Limit and PI kW Hi Limit are each 5%, then the PI output can only go+/−%5 higher or lower than its expected value since it is limited by the absolute limit values. PI output would then limit (saturate) if, for example, the engine could not produce the expected power. The absolute limit values may be calculated using the following equations (6) and (7):

$$\text{Absolute PI Low Limit} = \text{PI Reference} - \text{average set load} - \text{PI kW Low Limit} \quad (6)$$

$$\text{Absolute PI Hi Limit} = \text{PI Reference} - \text{average set load} + \text{PI kW Hi Limit} \quad (7)$$

The PI controller will also provide an offset to try to keep the set load equal to the PI reference. The purpose of the limit is to prevent the PI loop from providing an excessive offset in the event is it not possible for the PI loop to match the PI reference. This could occur, for example, if an engine malfunction prevented the engine from being able to supply its rated output.

In some examples, the output of the PI controller can be limited when ramping on or off a load. Note that load ramping is discussed in detail in Part IX below. When load ramping is occurring, the PI Reference value can start at zero, and subsequently, the absolute limits for the PI controller can follow the ramp.

d. Load Share State

In some examples, the PI controller can provide a load share state as an output (LS State; see 432 in FIG. 4). A load share state can be used to indicate the state of the PI controller. The load share states can include, for example, no local offset state, PI not limited state and PI limited state. When 432=1, then LS State=PI Limited. This occurs when either PI Reference is equal to Max Limit, the PI output is saturated at an absolute min or max level, or if the alternate limit control is used and is limiting because the average non-limited load is above the Max Limit. The PI Limited state can indicate that either the PI reference is at the Max Limit or the output of PI loop has reached its absolute maximum high or low limit described in the previous section. It indicates that the power and the node are limited. The PI not limited state can indicate that the PI controller is in the on state and the output 446 has not reached a predetermined threshold, e.g., a maximum value and/or a minimum value. The PI limited state can indicate that the PI controller is in the on state and saturated. Further, the load share state out may indicate if alternate limit is active.

2. Alternate Limit Control

In some examples, the local offset state is selected when the power is limited manually. In one example, the offset selection (see region 403) when the power is limited manually is "Alternate" (see 417 in FIG. 4). In some examples, the "Alternate" state is manually selected.

The algorithm involved when the offset selection is "Alternate" is illustrated in the region 420. The algorithm generally involves determining if the average non-limited load is greater than a predetermined maximum limit (428), and determining a local offset based on the following conditions: (1) if the average non-limited load is greater than the predetermined maximum load, then determine a local offset based on a manual offset, a maximum limit and an average set load (423); (2) if the average non-limited load is less than or equal to a predetermined maximum load, then determine a local offset based on the manual offset (416).

In some examples, the network node 173 is limited when the power is limited manually.

IX. Load Ramping

In some examples, the network node 173 is limited when the system 100 is load ramping. Load ramping can occur when a genset (e.g., one of the gensets 119) is added to a connected power system (e.g., the power system 100). As loads are added or removed from a system of gensets that are sharing a load, the number of gensets required to support the load can change. To ensure minimal voltage and frequency disturbance to the load, the gensets load is ramped on or off as they are added or removed from the bus. An exception to this is where the gensets supplying the load become overloaded. In this instance, it may be desirable to skip the ramp when adding sets to remove the overload as quickly as possible. Load ramping is done using the power limiting function described in the previous section using either the alternate limit control or the PI control. In either case the Max Limit variable is ramped up or down depending on whether you are adding or removing a genset from the system. More than one set can be ramped on or off at a time.

In some examples, adding a genset to the system means that a genset that is offline becomes connected so as to be online. In some instances, the genset is offline when the circuit breaker for that genset is open, and the genset is online when the circuit breaker for that genset is closed and is in the load share mode.

In general, load ramping can occur when gensets are added to a system. When a set is added, the Max Limit is set to zero on the set that is being added, which causes the power on that set to be zero. The Max Limit then can be ramped up until the Max Limit is greater than the average set load, at which point both sets will have the same load. As an example scenario, when a genet is added to a system that already has, e.g., two sets online at the point of circuit breaker closure, the offsets are re-initialized to new values. This is because of the step change in the average system power that occurs. For example, if a new set is added to a two set system with two sets operating with a 50% average load, the average load may change to 33%. Since the offsets are based off the average load, the offsets are changed to support the new average value. If a PI controller is in the on state for the genset being added, then the PI Reference is initialized to the new desired load on that genset so that the genset can operate with the correct offset.

Figure 6:
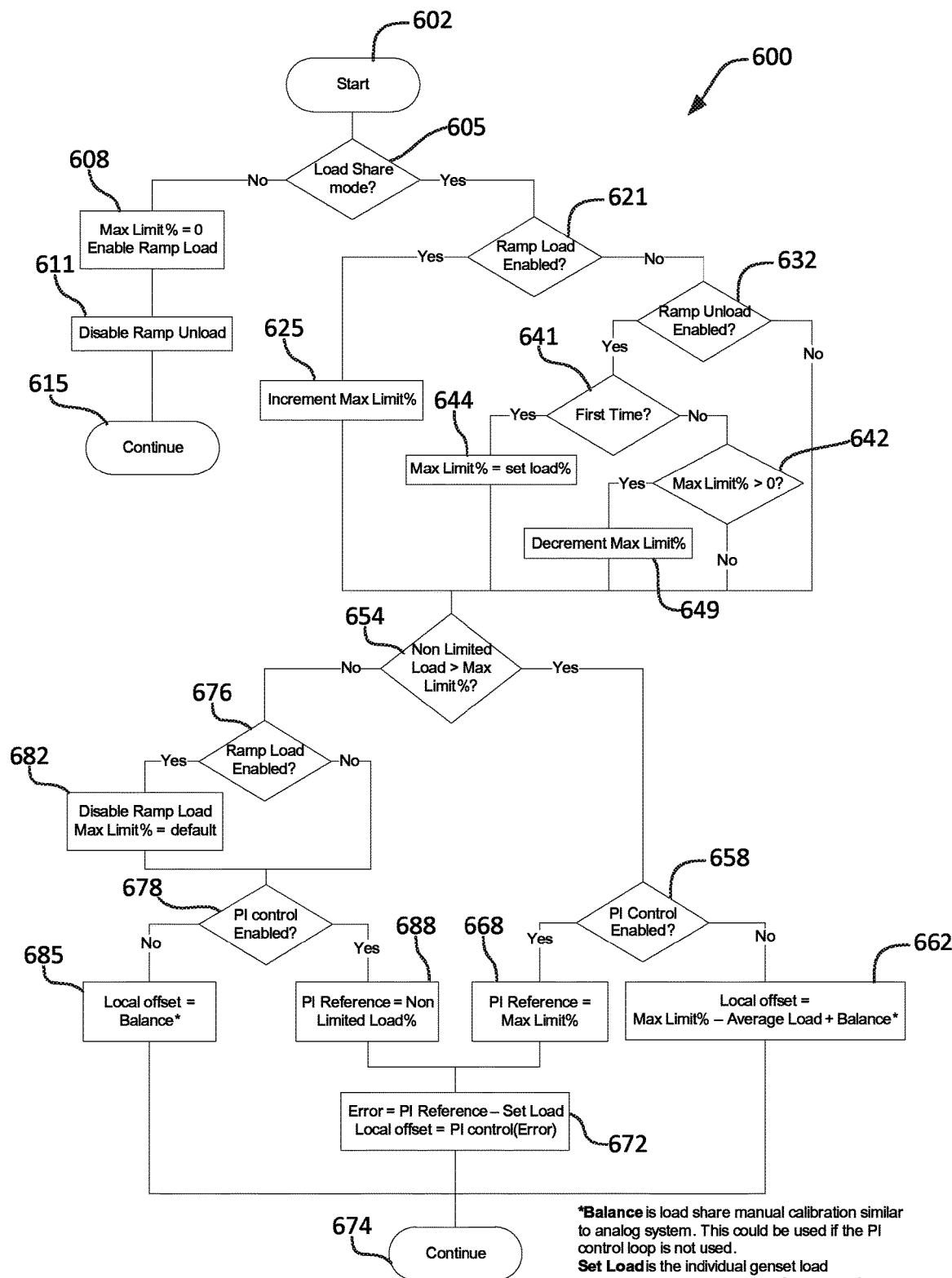
FIG. 6 is a diagram that illustrates operations performed during the ramping on and off of a load when a genset is added or removed from the system, according to one embodiment.

A diagram of operations involved when a genset is added to the connected power system is provided in FIG. 6 (see algorithm 600 in FIG. 6). In the example described below, the algorithm 600 is implemented by the load sharing controllers 162 of the genset 119 that is being added. The algorithm 600 may start at 602 and proceeds to 605, at which a determination is made as to whether the genset is in load share mode. The genset being in load share mode typically means that the genset is online. If the genset is not in load share mode, then the algorithm may reset the max limit % and enable ramp load at 608, disable ramp unload at 611, and then proceed to continue at 615.

If the genset is online and in load share mode at 605, then a determination is made if there ramp load is enabled at 621. If ramp load is enabled, then the max limit % is incremented at 625 and the algorithm proceeds to 654. If there is no ramp load, then a determination is made if ramp unload is enabled at 632. If ramp unload is enabled, then a determination is made if the ramp unload is being implemented for the first time at 641. If there is no ramp unload, then the algorithm can proceed to 654. If the ramp unload is being implemented for the first time, then the max limit % is initialized to the set load % at 644, and the algorithm proceeds to 654. If the ramp unload is not being implemented for the first time, then a determination is made at 642 if the max limit % is greater than zero. If the max limit % is greater than zero, the max limit % is decremented at 649 and the algorithm proceeds to 654. If the max limit % equals zero, the algorithm proceeds to 654.

At 654, a determination is made as to whether a non-limited load is greater than the max limit %. The non-limited load is equal to the sum of the load of the gensets with no local offsets divided by the number of gensets with local offsets. If the non-limited load is greater than the max limit %, then a determination is made if the PI controller is enabled at 658. If the PI controller is not enabled, then the local offset is determined to be the max limit % minus the average load plus a balance at 662. The balance can be, for example, a load share manual calibration that is, for example, similar to an analog system. The algorithm then proceeds to continue at 674.

If the PI controller is determined to be enabled at 658, then the PI reference is set to be equal to the max limit % at 668. The error then is set to be equal to the PI Reference value minus the set load, and the local offset is set to be equal to the power error generated by the PI controller at 672. The algorithm then proceeds to continue at 674.

Referring back to 654, if the non-limited load is not greater than the max limit %, then a determination is made at 676 as to whether ramp load is enabled. If ramp load is not enabled, then the algorithm proceeds to 678. If the ramp load is enabled, then ramp load is disabled and the max limit % is reset to default at 682, and then the algorithm proceeds to 678.

At 678, a determination is made as to whether the PI controller is enabled. If the PI controller is not enabled, then the local offset is set to be equal to the balance at 685. If the PI controller is enabled, then the PI reference is set to be equal to the non-limited load % at 688, and the error then is set to be equal to the PI reference minus the set load, and the local offset is set to be equal to the power error generated by the PI controller at 672. The algorithm then proceeds to continue at 674.

One or more flow diagrams have been used herein. The use of flow diagrams is not meant to be limiting with respect to the order of operations performed. The herein-described subject matter sometimes illustrates different components contained within, or connected with, different other components. It is to be understood that such depicted architectures are merely exemplary, and that in fact many other architectures can be implemented which achieve the same functionality. In a conceptual sense, any arrangement of components to achieve the same functionality is effectively "associated" such that the desired functionality is achieved. Hence, any two components herein combined to achieve a particular functionality can be seen as "associated with" each other such that the desired functionality is achieved, irrespective of architectures or intermedial components. Likewise, any two components so associated can also be viewed as being "operably connected," or "operably coupled," to each other to achieve the desired functionality, and any two components capable of being so associated can also be viewed as being "operably couplable" to each other to achieve the desired functionality. Specific examples of operably couplable include but are not limited to physically mateable and/or physically interacting components and/or wirelessly interactable and/or wirelessly interacting components and/or logically interacting and/or logically interactable components.

With respect to the use of substantially any plural and/or singular terms herein, those having skill in the art can translate from the plural to the singular and/or from the singular to the plural as is appropriate to the context and/or application. The various singular/plural permutations may be expressly set forth herein for sake of clarity.

It will be understood by those within the art that, in general, terms used herein, and especially in the appended claims (e.g., bodies of the appended claims) are generally intended as "open" terms (e.g., the term "including" should be interpreted as "including but not limited to," the term "having" should be interpreted as "having at least," the term "includes" should be interpreted as "includes but is not limited to," etc.). It will be further understood by those within the art that if a specific number of an introduced claim recitation is intended, such an intent will be explicitly recited in the claim, and in the absence of such recitation no such intent is present. For example, as an aid to understanding, the following appended claims may contain usage of the introductory phrases "at least one" and "one or more" to introduce claim recitations. However, the use of such phrases should not be construed to imply that the introduction of a claim recitation by the indefinite articles "a" or "an" limits any particular claim containing such introduced claim recitation to inventions containing only one such recitation, even when the same claim includes the introductory phrases "one or more" or "at least one" and indefinite articles such as "a" or "an" (e.g., "a" and/or "an" should typically be interpreted to mean "at least one" or "one or more"); the same holds true for the use of definite articles used to introduce claim recitations. In addition, even if a specific number of an introduced claim recitation is explicitly recited, those skilled in the art will recognize that such recitation should typically be interpreted to mean at least the recited number (e.g., the bare recitation of "two recitations," without other modifiers, typically means at least two recitations, or two or more recitations). Furthermore, in those instances where a convention analogous to "at least one of A, B, and C, etc." is used, in general such a construction is intended in the sense one having skill in the art would understand the convention (e.g., "a system having at least one of A, B, and C" would include but not be limited to systems that have A alone, B alone, C alone, A and B together, A and C together, B and C together, and/or A, B, and C together, etc.). In those instances where a convention analogous to "at least one of A, B, or C, etc." is used, in general such a construction is intended in the sense one having skill in the art would understand the convention (e.g., "a system having at least one of A, B, or C" would include but not be limited to systems that have A alone, B alone, C alone, A and B together, A and C together, B and C together, and/or A, B, and C together, etc.). It will be further understood by those within the art that virtually any disjunctive word and/or phrase presenting two or more alternative terms, whether in the description, claims, or drawings, should be understood to contemplate the possibilities of including one of the terms, either of the terms, or both terms. For example, the phrase "A or B" will be understood to include the possibilities of "A" or "B" or "A and B."

The foregoing description of illustrative implementations has been presented for purposes of illustration and of description. It is not intended to be exhaustive or limiting with respect to the precise form disclosed, and modifications and variations are possible in light of the above teachings or may be acquired from practice of the disclosed implementations. It is intended that the scope of the invention be defined by the claims appended hereto and their equivalents.

What is claimed is:

1. A method comprising:
   determining, by a processor of a control system, an average set load corresponding to a plurality of gensets of a power system;
   generating, by the processor, a power error indicative of a difference between the determined average set load and a set load of a genset in operation, wherein the genset is one of the plurality of gensets of the power system;
   generating, by the processor, a first offset for modifying operation of the genset, wherein the first offset is a product of the power error and a predetermined factor;
   determining, by the processor, a secondary offset for modifying operation of the genset, wherein the secondary offset is indicative of an additional load offset for the genset on top of the power error;
   generating, by the processor, a final offset, wherein the final offset combines the first offset and the secondary offset;
   generating, by the processor, a final reference value, wherein the final reference value modifies a nominal reference of the genset using the final offset; and
   modifying, by the processor, operation of the genset by using the final reference value to obtain proportional load sharing between the plurality of gensets.

2. The method of claim 1, wherein determining the secondary offset comprises selecting either a local offset of a network node corresponding to the genset or a system offset corresponding to the power system, wherein the local offset is an offset imposed by the genset, and wherein the system offset is an offset imposed by the power system.

3. The method of claim 2, wherein the system offset is a negative sum of each local offset of gensets in a local offset state divided by a number of gensets in a system offset state.

4. The method of claim 2, wherein the local offset is selected in response to the network node being in a local offset state, and wherein the system offset is selected in response to the network node being in a system offset state.

5. The method of claim 4, wherein the system offset state is selected in response to the local offset state being not selected.

6. The method of claim 4, wherein the local offset state is selected in response to a PI controller of the genset being in an on state or the average set load being greater than a maximum limit.

7. The method of claim 6, wherein the network node is power limited in response to the average set load being greater than a maximum limit of the network node or the PI controller being saturated.

8. The method of claim 6, further comprising determining, by the processor whether the PI controller should be in the on or off state.

9. The method of claim 8, wherein the PI controller is switched to the off state in response to at least one of the following:
there are no other gensets having PI controllers in the off state and the network node has a lowest address that is not power limited;
a number of gensets online is less than or equal to one;
a paralleling state of the network node is not equal to load share;
there is a loss of communication between one or more network nodes; or
a total system load is greater than a maximum limited capacity.

10. The method of claim 9, wherein the PI controller is switched to the on state in response to at least one of the following:
the paralleling state of the network node is equal to load share;
the number of gensets online is greater than one;
the total system load is less than the maximum limited capacity and two or more gensets have PI controllers in the off state and the network node has a highest address; or
the set load is greater than a limit set for derating or ramping.

11. The method of claim 10, further comprising, in response to the PI controller being in the on state:
determining, by the processor, an average non-limited load;
generating, by the processor, a second power error based on the determined average non-limited load and the set load;
determining, by the processor, if the network node is limited based on a predetermined reference value; and
generating, by the processor, the local offset which is a product of the second power error and a second predetermined factor.

12. The method of claim 6, wherein the method is implemented in response to an additional genset being added to the power system and load ramping being occurring.

13. The method of claim 12, further comprising initializing, by the processor, a PI reference to a desired load on the additional genset being added.

14. A control system comprising:
a processor configured to:
determine an average set load corresponding to a plurality of gensets of a power system;
generate a power error indicative of a difference between the determined average set load and a set load of a genset in operation, wherein the genset is one of the plurality of gensets of the power system;
generate a first offset for modifying operation of the genset, wherein the first offset is a product of the power error and a predetermined factor;
determine a secondary offset for modifying operation of the genset, wherein the secondary offset is indicative of an additional load offset for the genset on top of the power error;
generate a final offset, wherein the final offset combines the first offset and the secondary offset;
generate a final reference value, wherein the final reference value modifies a nominal reference of the genset using the final offset; and
modify operation of the genset by using the final reference value to obtain proportional load sharing between the plurality of gensets.

15. The control system of claim 14, wherein determining the secondary offset comprises selecting either a local offset of a network node corresponding to the genset or a system offset corresponding to the power system, wherein the local offset is an offset imposed by the genset, and wherein the system offset is an offset imposed by the power system.

16. The control system of claim 15, wherein the system offset is a negative sum of each local offset of gensets in a local offset state divided by a number of gensets in a system offset state.

17. The control system of claim 15, wherein the processor is further configured to select the local offset in response to the network node being in a local offset state, and to select the system offset in response to the network node being in a system offset state.

18. The control system of claim 17, wherein the processor is further configured to select the system offset state in response to the local offset state being not selected.

19. The control system of claim 17, wherein the processor is further configured to select the local offset state in response to a PI controller of the genset being in an on state or the average set load being greater than a maximum limit.

20. The control system of claim 19, wherein the network node is power limited in response to the average set load being greater than a maximum limit of the network node or the PI controller being saturated.

* * * * *